(12) United States Patent
Hirahara et al.

(10) Patent No.: US 8,463,116 B2
(45) Date of Patent: Jun. 11, 2013

(54) SYSTEMS FOR CURING DEPOSITED MATERIAL USING FEEDBACK CONTROL

(75) Inventors: Edwin Hirahara, Federal Way, WA (US); David L Lee, Tacoma, WA (US)

(73) Assignee: Tap Development Limited Liability Company, Wilmington, DE (US)

( * ) Notice: Subject to any disclaimer, the term of this patent is extended or adjusted under 35 U.S.C. 154(b) by 1279 days.

(21) Appl. No.: 12/165,892

(22) Filed: Jul. 1, 2008

(65) Prior Publication Data
US 2010/0003021 A1    Jan. 7, 2010

(51) Int. Cl.
*F26B 19/00* (2006.01)

(52) U.S. Cl.
USPC .......................................... 392/418; 118/722

(58) Field of Classification Search
USPC .................................. 392/407–464
See application file for complete search history.

(56) References Cited

U.S. PATENT DOCUMENTS

| | | |
|---|---|---|
| 5,204,823 A | 4/1993 | Schlotterbeck |
| 5,264,061 A | 11/1993 | Juskey |
| 5,302,954 A | 4/1994 | Brooks |
| 5,656,229 A | 8/1997 | Tanimoto |
| 5,744,823 A | 4/1998 | Harkin |
| 5,814,165 A | 9/1998 | Tatah |
| 5,870,031 A | 2/1999 | Kaiser |
| 5,973,598 A | 10/1999 | Beigel |
| 6,121,130 A | 9/2000 | Chua |
| 6,134,130 A | 10/2000 | Connell |
| 6,151,446 A * | 11/2000 | Hunter et al. ................ 392/416 |
| 6,399,258 B2 | 6/2002 | O'Brien |
| 6,414,543 B1 | 7/2002 | Beigel |
| 6,524,346 B1 | 2/2003 | Farnworth |
| 6,531,191 B1 | 3/2003 | Notenboom |
| 7,003,680 B2 | 2/2006 | Masui |
| 7,026,581 B2 * | 4/2006 | Pharand et al. ............... 219/392 |
| 7,161,590 B2 | 1/2007 | Daniels |
| 7,223,995 B2 | 5/2007 | Fix |
| 7,622,378 B2 | 11/2009 | Liu |
| 2002/0018648 A1 * | 2/2002 | Meyer et al. .................. 392/418 |
| 2003/0178620 A1 | 9/2003 | Bernds |

(Continued)

FOREIGN PATENT DOCUMENTS

| | | |
|---|---|---|
| DE | 27 35 231 A1 | 2/1979 |
| DE | 37 41 916 C2 | 6/1989 |

(Continued)

OTHER PUBLICATIONS

Japanese Inquiry mailed Jun. 8, 2012, in Application No. JP 2008-164040, filed Jun. 24, 2008, 3 pages.

(Continued)

*Primary Examiner* — Thor Campbell
(74) *Attorney, Agent, or Firm* — Christensen O'Connor Johnson Kindness PLLC (57) ABSTRACT

Systems are provided for curing a deposited curable material film using a light source and feedback system for monitoring the degree of curing using detected optical properties of the film. Operational parameters of the light source (e.g., power) are adjusted by a control system in response to the detected optical properties of the film. In certain embodiments, the curing system includes at least one light source in optical communication with an uncured material, a detector for monitoring an optical property of the curing material, and a feedback system for controlling the light emitted from the light source in response to the detector.

17 Claims, 3 Drawing Sheets

U.S. PATENT DOCUMENTS

| | | |
|---|---|---|
| 2005/0276912 A1 | 12/2005 | Yamamoto |
| 2006/0044555 A1 | 3/2006 | Wang |
| 2006/0246693 A1 | 11/2006 | Tanaka |
| 2007/0082438 A1 | 4/2007 | Li |
| 2008/0063809 A1 | 3/2008 | Lee |
| 2008/0197343 A1 | 8/2008 | Blache |
| 2010/0035375 A1 | 2/2010 | Grigoropoulos |

FOREIGN PATENT DOCUMENTS

| | | |
|---|---|---|
| DE | 102 09 400 A1 | 10/2003 |
| JP | 61-288487 A | 12/1986 |
| JP | 62-216320 A | 9/1987 |
| JP | 62-259437 A | 11/1987 |
| JP | 5-152560 A | 6/1993 |
| JP | 5-259434 A | 10/1993 |
| JP | 9-121156 A | 5/1997 |
| JP | 09-289366 A | 11/1997 |
| JP | 11-508326 A | 7/1999 |
| JP | 11-515143 A | 12/1999 |
| JP | 2000-098655 A | 4/2000 |
| JP | 2001-265122 A | 9/2001 |
| JP | 2001-267417 A | 9/2001 |
| JP | 2001-516110 A | 9/2001 |
| JP | 2001-332658 A | 11/2001 |
| JP | 2002-212236 A | 7/2002 |
| JP | 2002-236890 A | 8/2002 |
| JP | 2002-299442 A | 10/2002 |
| JP | 2002-535701 A | 10/2002 |
| JP | 2003-309268 A | 10/2003 |
| JP | 2003-318407 A | 11/2003 |
| JP | 2004-048030 A | 2/2004 |
| JP | 2004-095732 A | 3/2004 |
| JP | 2004-508731 A | 3/2004 |
| JP | 2004-515070 A | 5/2004 |
| JP | 2004-186556 A | 7/2004 |
| JP | 2004-200652 A | 7/2004 |
| JP | 2004-224835 A | 8/2004 |
| JP | 2004-363346 A | 12/2004 |
| JP | 2005-079288 A | 3/2005 |
| JP | 2005-183889 A | 7/2005 |
| JP | 2005-203762 A | 7/2005 |
| JP | 2005-521313 A | 7/2005 |
| JP | 2005-251987 A | 9/2005 |
| JP | 2005-302842 A | 10/2005 |
| JP | 2006-500607 A | 1/2006 |
| JP | 2006-310346 A | 11/2006 |
| JP | 2006-332568 A | 12/2006 |
| JP | 2007-086721 A | 4/2007 |
| JP | 2007-103947 A | 4/2007 |
| JP | 2007-140527 A | 6/2007 |
| JP | 2007-150240 A | 6/2007 |
| JP | 2007-263841 A | 10/2007 |
| JP | 2008-511835 A | 4/2008 |
| JP | 2008-523595 A | 7/2008 |
| JP | 2009-289366 A | 12/2009 |
| WO | 03/038897 A2 | 5/2003 |
| WO | 2005/027216 A2 | 3/2005 |
| WO | 2005/062376 A1 | 7/2005 |
| WO | 2005/070016 A2 | 8/2005 |
| WO | 2007/055849 A2 | 5/2007 |

OTHER PUBLICATIONS

Baude, P.F., et al., "Organic Semiconductor RFID Transponders," IEEE International Electron Devices Meeting, D.C., Dec. 8-10, 2003, pp. 8.1.1-8.1.4.

Crone, B.K., et al., "Design and Fabrication of Organic Complementary Circuits," Journal of Applied Physics 89(9):5125-5132, May 2001.

Japanese Patent Office Action mailed Jan. 24, 2012, issued in Application No. JP 2008-117116, filed May 27, 2008, 4 pages.

Japanese Patent Office Action mailed Jan. 24, 2012, issued in Application No. JP 2008-527041, filed Aug. 14, 2006, 4 pages.

Japanese Patent Office Action mailed Feb. 14, 2012, issued in Application No. JP 2009-507667, filed Nov. 16, 2006, 3 pages.

Japanese Appeal Decision mailed Oct. 22, 2012, in Japanese Application No. JP 2008-164040, filed Jun. 24, 2008, 14 pages.

* cited by examiner

SYSTEMS FOR CURING DEPOSITED MATERIAL USING FEEDBACK CONTROL

BACKGROUND

Printed electronics may be viewed as an extension of printed circuit board technology. Generally described, a printed circuit board includes a substrate with conductive metal paths for wiring. All other electronic components are made separately and are soldered or clamped to the substrate of the printed circuit board. In more recent developments, semiconductor integrated circuits are now produced to perform most electronic circuit functions. Production of integrated circuits, however, requires the use of specialized semiconductor substrates and is expensive and impractical for producing ultra low-cost electronic devices. For example, typically the cost of integrated circuits cannot be lowered significantly and even a relatively low level of cost cannot be achieved unless the integrated circuits are produced in a very high volume because of the very high cost of an integrated circuit fabrication line.

Printed electronics are formed by printing images layer by layer, i.e., by depositing one or more layers of material on a wide variety of substrates, including uncoated or coated paper, laminated paper products, various plastic films such as polyethylene or polynaphthalene, etc. With printed electronics technology, it is possible to produce microelectronic components of an electronic circuit. Some examples of microelectronic components that may be produced include transistors, capacitors, resistors, diodes, and light emitting diodes, while examples of complete circuits include RFID tags, sensors, flexible displays, etc. As an example, a capacitor can be constructed by depositing a conducting area, followed by depositing a larger insulating layer, and then another conducting area. This process can be repeated to obtain higher capacitance. As another example, a field-effect transistor can be formed by depositing a conductor layer forming source and drain electrodes, a semiconductor layer, a dielectric layer, and then another conductor layer forming a gate electrode.

Especially when low-cost conducting and semiconducting materials, such as organic polymers, are used as the materials to be deposited, printed electronics forming complete functional circuits (e.g., RFID tags) may be produced at a very low cost on the order of about one-tenth of the cost of producing analogous integrated circuits. Such low-cost printed electronics are not expected to compete directly with silicon-based integrated circuits. Rather, printed electronics circuits may be produced to offer lower performance (e.g., lower frequency, lower power, or shorter lifetime) at much lower cost as compared to silicon-based integrated circuits.

Printed electronics components are made using a set of materials, typically five to seven different materials. These are usually liquids with dissolved and/or suspended polymers, polymer precursors, inorganic materials, and organic or inorganic additives, and are deposited in a wet printing process. Typical wet printing methods include letterpress-printing, screen-printing, and ink jet printing. Specifically, these materials are deposited in a desired sequence on a substrate and are often cured or activated by a thermal cycling and/or humidity treatment using a convection oven or by use of visible or invisible light.

Conductive inks are materials that are particularly useful in printed electronics as electrodes and connections between components. Conductive inks are, in some ways, incompatible with printed electronics because they must be cured at relatively high temperatures (typically ~80° C. or more), which may be detrimental to other materials useful in printed electronics.

Therefore, improved curing processes are desirable in the printed electronic industry. Moreover, a technique that cures printed materials, including conductive inks, while minimizing the amount of heat diffused to adjacent materials of a printed electronic device would be desirable, as it would significantly enhance the compatibility and use of conductive inks with printed electronics.

SUMMARY

In one aspect of the present disclosure, a method for curing a material is provided. The method comprises the steps of providing a substrate having a curable material deposited thereon in an uncured state; emitting an amount of light from a first light source having one or more light source operational parameters, which impinges on at least a portion of the deposited curable material for initiating curing of the curable material; monitoring a curing characteristic of the curable material as the portion of the curable material transitions from the uncured state to a cured state; and varying at least one of the one or more light source operational parameters based on the monitored curing characteristic as the portion of the curable material cures.

In another aspect of the present disclosure, a method for curing a conductive ink is provided. The method comprises the steps of providing a substrate having a curable silver ink deposited thereon in an uncured state; emitting an amount of light from a first light source having one or more light source operational parameters, which impinges on at least a portion of the deposited curable silver ink for initiating curing of the curable silver ink; monitoring the reflectivity of the curable silver ink as the portion of the curable silver ink transitions from the uncured state to a cured state; and varying at least one of the one or more light source operational parameters based on the monitored reflectivity as the portion of the curable silver ink cures.

In another aspect of the present disclosure, a system for curing a material is provided. The system comprises a support having a surface for supporting a substrate having a curable material deposited thereon; a first light source disposed at least in partial optical communication with the support; a detector for monitoring light that impinges on the curable material; and a feedback system capable of controlling light emitted from the first light source in response to the detector.

Methods and systems are described herein for curing materials, such as conductive inks, to produce, for example, conductive areas or paths for printed electronic circuits. One method uses one or more light sources to provide light with a short pulse length relative to the interval between pulses. Other components, such as a lens to focus the light, an X-Y beam steering module, and/or X-Y motion table for controlling the position of the spot of light on selected areas of an uncured material, may also be used. In one embodiment, a computer and electronic interface circuits control and/or adjust the amount of light emitted from the light source, lens focus and/or light source pulsing, etc. and moves the focused or partially focused emitted light to the areas on the electronic circuit for which curing is desired. In addition, a monitoring device, such as an optical detector, may be used to provide feedback to the computer for monitoring curing performance and for controlling the operation of the light source and/or other system components as the material cures.

One advantage, among others, of this dynamic curing process is that optimum conversion of a conductive material, such as a conductive ink, to a desired conductive path can be achieved even for variation in the ink deposition, ink materials, or of the size or shape of the area being cured. The brief but intense pulses of light employed, in one example, to a small area with a relatively long time between pulses allows for curing without significantly heating or affecting the remainder of the printed electronic circuit. This curing with feedback control can lead to a faster curing process and higher quality conducting paths, as well as increased compatibility between the materials to be cured and temperature-sensitive materials already deposited.

DESCRIPTION OF THE DRAWINGS

The foregoing aspects and many of the attendant advantages of this the provided embodiments will become more readily appreciated by reference to the following detailed description, when taken in conjunction with the accompanying drawings, wherein.

DETAILED DESCRIPTION

Embodiments of the present disclosure will now be described with reference to the accompanying drawings, where like numerals correspond to like elements. The following description provides examples of systems and methods for curing materials (interchangeably referred to herein as "ink" when used in the context of a material deposited by printing), such as conductive ink, deposited on a substrate, with the use of a light source. Embodiments described herein employ a feedback system for monitoring the degree of curing of the material, the results of which may then be used to control the operational parameters of the light source and/or the operational parameters of other system components, such as a lens module, modulator, positioning device, etc. The examples of the curing systems and methods described herein are suitable for use in the fabrication of printed electronics such as components, elements, completed circuits, partially-completed circuits, devices, and the like.

Figure 1:
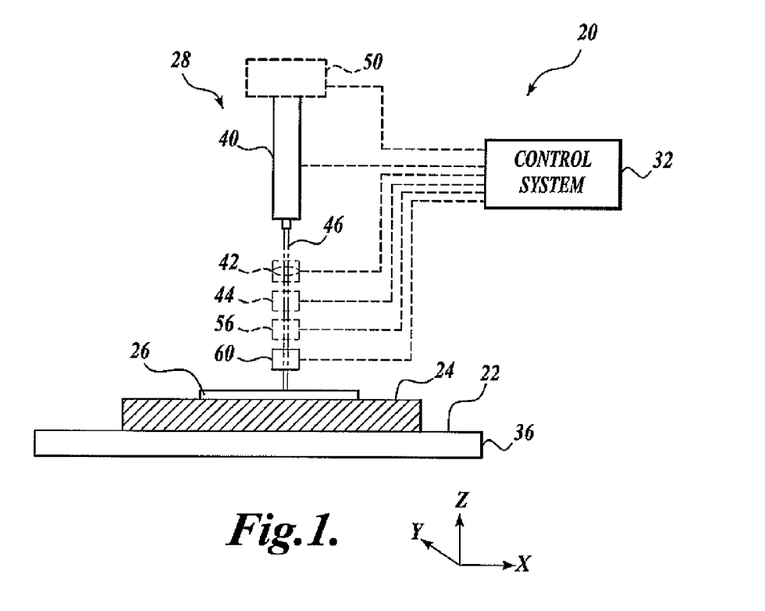
FIG. 1 is a schematic illustration of one representative curing system formed in accordance with aspects of the present disclosure.

Referring now to FIG. 1, a schematic diagram shows one representative curing system, generally designated 20, which is formed in accordance with aspects of the present disclosure. Generally described, the system 20 includes a support surface 22 for supporting a substrate 24 having at least one ink layer 26 deposited thereon, at least one curing device 28 for curing the at least one deposited ink layer 26, a control system 32 for controlling the overall curing process, and a detector 60 for monitoring at least one curing characteristic or property of the ink layer 26 as it is curing.

The components of the system 20 will now be described in more detail. In the embodiment of FIG. 1, the support surface 22 is defined by the top of a stationary or movable bed or platen 36. In these embodiments, the substrate 24 may be placed on the bed or platen 34 manually or by automated material handling equipment (not shown) such as in-feeders, pick and place material handlers, etc. In other embodiments of the present disclosure, the support surface 22 may be a portion of a substrate advancement apparatus (not shown), such as a conveyor belt, conveyor tracks, or the like. The substrate 24 may be also in web form, and advanced with respect to the curing system 20 via substrate advancement apparatuses known in the art. In this embodiment, the support surface 22 may be defined by a bed or platen positioned under the curing device, which supports the web of substrate.

The substrate 24 may be one of a variety of substrates, including but not limited to uncoated or coated paper, laminated paper products, glass, various plastic films such as polyethylene, polypropylene, and others known to those of skill in the art. The ink layer 26 may be deposited onto the top surface of the substrate 24 via various printing techniques, including but not limited to letterpress, flexographic, and ink jet. The ink layer 26 may be formed by any number of different inks, including conductive inks. Conductive inks are generally known in the art and are typically solvated conductive materials, such as metals or carbon. Examples of conductive inks that may be practiced with embodiments of the present disclosure include but are not limited to silver ink and carbon ink. Silver ink can include silver ions that convert to silver metal upon curing. In several embodiments, the ink layer 26 is deposited onto the substrate 24 prior to the substrate being supported by the support surface 22.

Still referring to FIG. 1, the curing device 28 is positioned adjacent to, e.g., above, the support surface 22. The curing device 28 is a device that cures one or more ink layers 26 that have been deposited onto the substrate 24. In embodiments where the deposited ink layer 26 is a conductive ink that has been printed for fabricating printed electronics, curing allows for the printed material to attain desirable electronic or electrical properties. In operation, the curing device 28 cures the ink layers 26 by means of local heating, solvent evaporation, chemical reactions, etc. It will be appreciated that the deposited ink layer 26 may include a catalyst to initiate or accelerate the chemical reaction(s).

As shown in FIG. 1, one embodiment of the curing device 28 includes at least one light source 40. The light source 40 can be any number of known light sources, including infrared, visible, and/or ultraviolet light from a high-intensity lamp or lamps (using a fast shutter, not pictured), by flash lamps (such as those used for electronic flash units for photography), or by one or more lasers. The light source 40 preferably includes one or more adjustable operational parameters. The operational parameters of the light source 40, including the wavelength or wavelengths of the light and the pulse length, interval, and intensity (if a pulsed source is used) can be adjusted for each type of material for providing optimal curing conditions. In an representative embodiment, visible light from a Xenon flash lamp is used, the light having a pulse length in the range of 100-1000 microseconds, and the spacing between the pulses is greater than the pulse length. In an representative embodiment, the energy density of the light pulse is about 1 joule per square centimeter. It will be appreciated that the type of light source 40 employed in various applications may be dependent upon the type and amount of material needed to be cured, in that particular wavelengths or powers may be needed or desirable to achieve optimal results. This optimization is readily achievable by those of skill in the art.

The light 46 emitted from the light source 40 may pass through one or more optional components, such as lens module 42, modulator 44, and/or X-Y positioner 56, before the light 46 impinges on the ink layer 26 deposited on the surface of a substrate 24. The optional lens module 42 of the curing device 28 is disposed downstream of the light source 40. The lens module 42 is capable of adjusting the focus of the light 46 emitted from the light source 40, which can be controlled with electrical signals from the control system 32. Focus adjustability provides the ability to dynamically maintain a desired illumination area on the ink layer 26. It may also be desirable, in several embodiments where sufficient light (power) is available, to defocus the light 46 using lens module 42 to create a larger illumination area. Thus a larger ink layer 26 area can be cured at one time. This can make it possible to achieve a shorter overall curing time. By means of dynamic control of the illumination area, high-resolution could be achieved where desired by refocusing the lens module 42 to make a small illumination area when desired.

The curing device 28 also optionally includes the modulator 44, which is positioned downstream of the lens module 42. The light 46 exiting the lens module 42 passes through the modulator 44, which is configured to vary the intensity of the light 46 passing therethrough. Such modulation can be done by one of several methods well known in the art. The amount of light 46 passed by the modulator 44 can be controlled with electrical signals from the control system 32. Additionally, the light source 40 itself can be pulsed to produce the desired amount of light 46.

Upon striking the ink layer 26, the light 46 emitted from the light source 40 begins the curing process. In a representative example, light 46 illuminating a conductive ink layer comprised of silver ink produces several effects, including conversion of dissolved ionic silver into silver metal particles, and the consolidation of silver metal nano-particles to form a conductive layer mechanically sturdy enough to serve as a conductor on the substrate 24. The conversion of dissolved ionic metal to metallic particles can be done by way of a chemical reaction initiated by the photons of the light 46 emitted from the light source 40 through a heating and evaporation process wherein the solvent or solvents that the conductive ink is partially composed of evaporate. The consolidation of the metallic nano-particles is similar to a sintering process that occurs at a much lower temperature than that of the melting temperature of the metal particles and is accomplished by heat, evaporation of the conductive ink solvents, and in some cases, by the polymerization of organic materials in the conductive ink.

In one embodiment, the light source 40 and/or optional modulator 44 may be controlled to produce high intensity, short duration pulses of light 46. The high intensity and short duration of the pulses of light 46 rapidly and selectively illuminate and heat controlled areas of the ink layer 26 and create local and very rapid heating of the illuminated areas. Such rapid heating enables the curing of the ink layer 26 without significantly heating the surrounding areas. In addition to localized heating, the volume of the ink layer 26 that is cured can be relatively small, thus allowing precise patterning of, for example, a conductive layer without significantly heating the entirety of the ink layer 26 or the substrate 24, which is important for applications where, for example, a conductive ink is deposited on or near temperature-sensitive materials, such as organic functional materials (e.g., organic semiconductors). Thus, if temperature-sensitive printed electronic materials are substantially adjacent to the curable ink layer 26, the ink layer 26 can be cured without substantially heating adjacent materials. Such selective heating avoids thermally-induced degradation of any adjacent materials. Both the short duration of light pulses and the small heating volume are beneficial to the above process. In one embodiment, the pulses of light 46 are shorter in duration than the time between the pulses.

In accordance with aspects of the present disclosure, several benefits may be achieved by monitoring the curing process of at least an area of the ink layer 26. To that end, the system 20 may include a monitoring device, such as an optical detector 60, for monitoring a curing characteristic or property of the ink layer 26. As will be described in more detail below, data signals generated by the detector 60 are utilized to precisely control the light 46 (amount, intensity, duration, etc.) delivered to the ink layer 26, to selectively cure only the desired location and volume of ink. Representative detectors 60 include photodetectors, such as photodiodes and CMOS and CCD devices. It will be appreciated that any device capable of optical detection may be employed as a detector 60.

In the embodiment illustrated in FIG. 1, the detector 60 is substantially in line with the light source 40 and the emitted light 46, such that the emitted light 46 reflects or scatters off of the surface of the ink layer 26 and such reflection or scattering is detected by the optical detector 60. It will be appreciated that other optical properties (e.g., absorption) can also be monitored, employing alternative light source 40 and detector 60 positioning (e.g., for absorption, a detector 60 on the opposite side of the ink layer 26 surface than the light source 40) so as to accomplish the desired technique.

Figure 2:
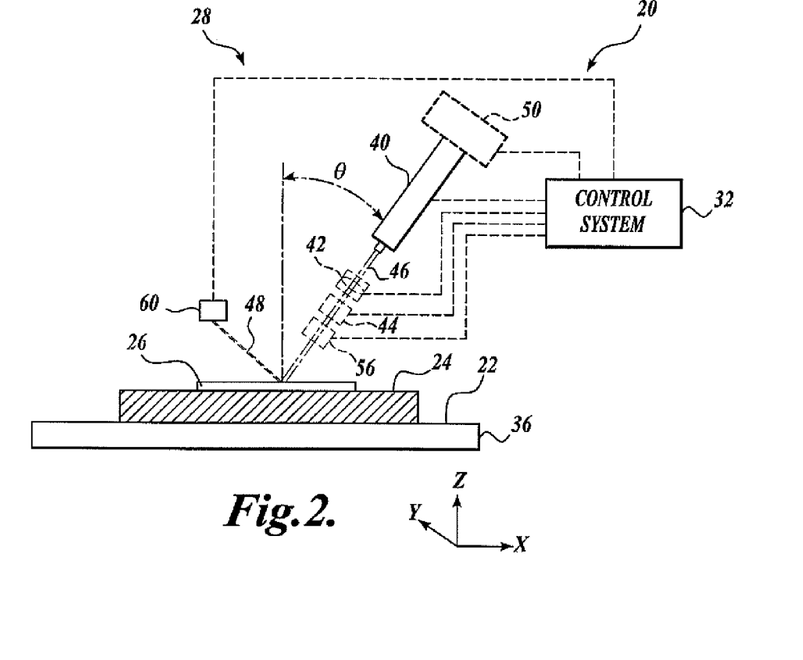
FIG. 2 is a schematic illustration of another representative curing system formed in accordance with aspects of the present disclosure.

In a second embodiment, illustrated in FIG. 2, the light source 40 and subsequent components (except detector 60) in the path of the emitted light 46 are at an angle θ from a line perpendicular to the surface of the ink Layer 26. The detector 60 is similarly at an angle substantially near θ from the perpendicular line, such that the emitted light 46 that reflects or scatters, designated 48, off of the surface of the ink layer 26 will impinge upon the optical detector 60.

Figure 3:
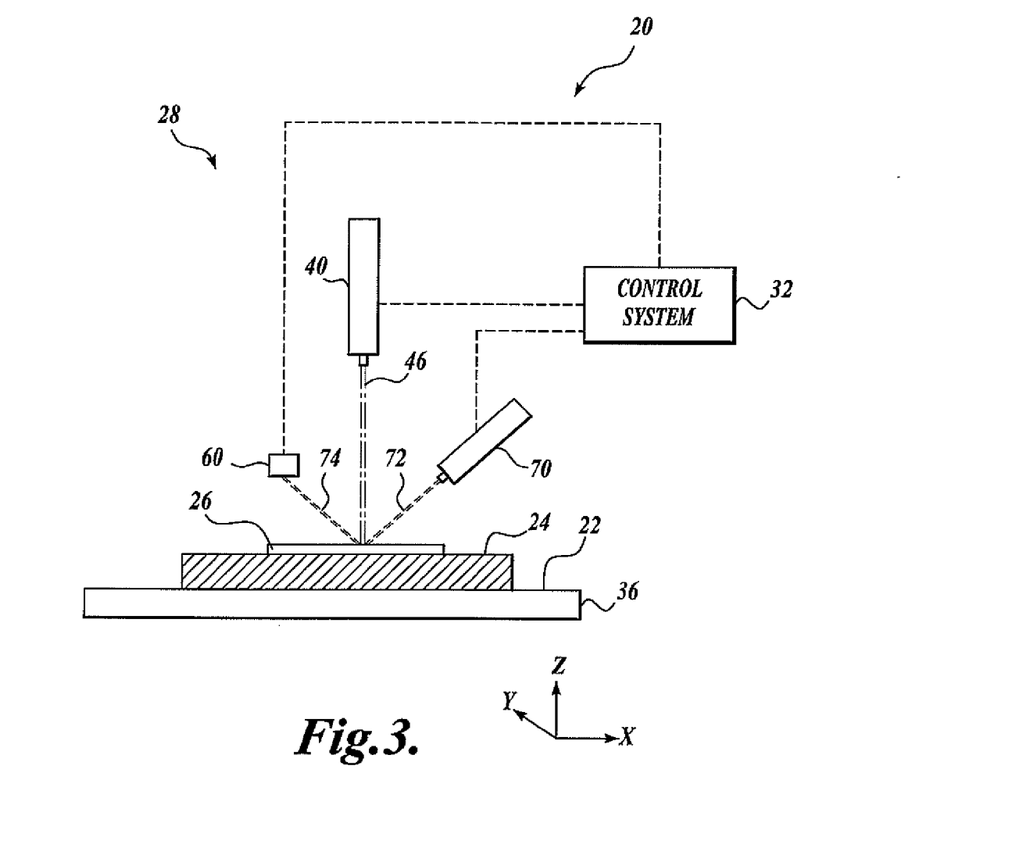
FIG. 3 is a schematic illustration of yet another representative curing system formed in accordance with aspects of the present disclosure.

A third embodiment is illustrated in FIG. 3, wherein a second light source 70 is included in the curing system 20, such that the light emitted by the (first) light source 40 is used to cure the ink layer 26 and the second light source 70 and detector 60 are used to monitor the degree of curing using the above-described optical properties. The configuration shown in FIG. 3 is useful, in particular, if the optical wavelengths used to cure or probe the degree of curing are independently optimizable and it is desirous to independently control the curing and detection processes. The optional light-manipulating components (e.g., modulator 44) are not illustrated in FIG. 3 for the purpose of clarity, and not limitation.

It will be appreciated that the curing system 20 is not limited to a particular number of light sources 40, 70, or detectors 60, as several of both can be included as needed.

As briefly discussed above, the system 20 further includes a control system 32, which controls the curing process. The control system 32 may comprise a computer or other processor appropriately programmed for controlling the curing process. In one embodiment, the control system 32 includes a computer with stored programs, data, etc., and various input/output circuitries to actively request and receive, or alternatively, passively receive a generated signal(s) indicative of the degree of curing from the detector 60. Based on the received signal(s), the control system 32 controls, in one embodiment, the operation of the light source 40. In other embodiments, the control system 32 utilizes the signal(s) to further control one or more other components, including but not limited to the lens module 42, the modulator 44, the beam deflecting module 56, the X-Y positioner 50, a substrate advancement apparatus (not shown), material handling equipment (not shown), and other aspects of the curing system 20. This control of other components may or may not be in conjunction with the control of the light source 40.

Figure 4:
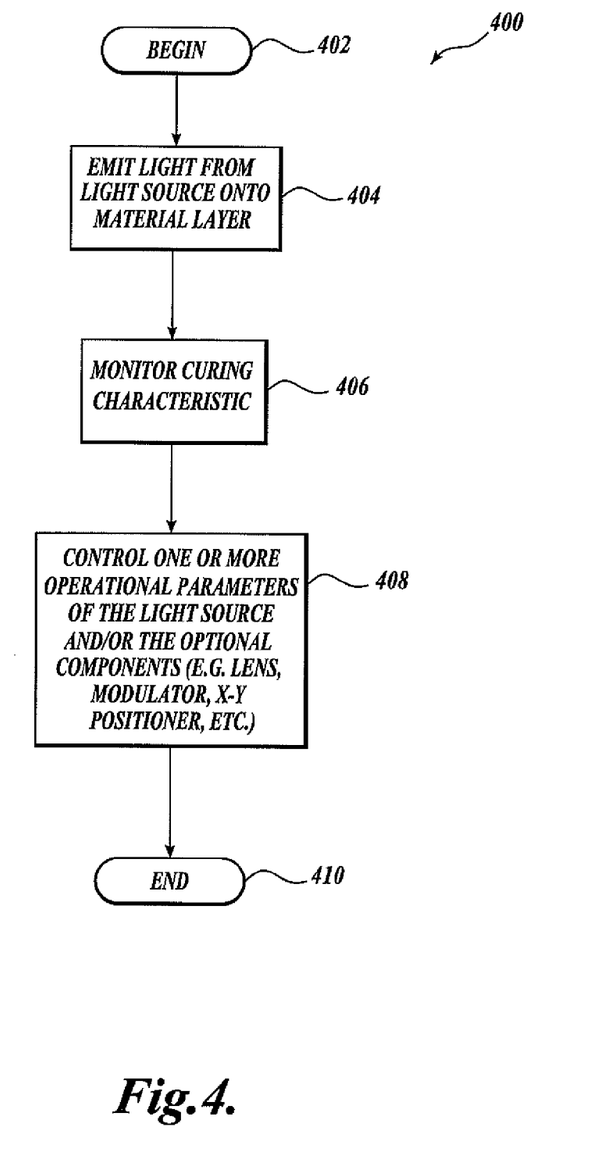
FIG. 4 is a block diagram illustrating an representative method in accordance with aspects of the present disclosure.

Referring now to FIG. 4, there is shown one method 400 employed by an embodiment of the curing system 20, wherein the curing characteristic or property to be monitored is the reflectivity of a ink layer 26 measured by the detector 60. The method begins at block 402 and proceeds to block 404, where the light source 40 is operated at suitable operational parameters to emit light 46 in the direction of the deposited ink layer 26 for curing the ink layer 26. The light source 40 may be operated by control signals transmitted from the control system 32. As the emitted light 46 impinges on the ink layer 26, the reflectivity of the ink layer 26 is monitored by the optical detector 60 at block 406.

In one embodiment, monitoring the reflectivity of the ink layer 26 includes measuring the reflectivity and transmitting the signals indicative of reflectivity (a curing characteristic or property) to the control system 32. Because the reflectivity of the surface of the connective ink layer 26 changes during the curing process, the reflectivity values can be determined to gauge the progress and eventual completion of curing, thus providing a feedback signal or signals to control the curing process.

At block 408, the generated signals are received by the control system 32, and processed accordingly to control the light source 40. These feedback information, i.e., signals, can be used, for example, to terminate the pulse sequence when a ink layer 26 has been cured as desired or to modify the amount of light (e.g., power, duration, wavelength, or duty cycle of intermittent light) emitted by the light source 40. It will be appreciated that the control system 32 can compare the signals to data located in computer memory in order to output suitable control signals to the light source 40 to turn on/off, vary the power, wavelength, etc. The degree of curing is dependent upon the type of ink layer 26 and the degree of curing required to achieve the desired property (e.g., level of conductivity for conductive inks). The signals may also be used to control the optional lens module 42 and/or the modulator 44 to obtain any desired result. The method 400 then ends at block 410.

The reflectivity measurement can be made using one or more wavelengths of light. The wavelengths of light can be chosen to provide data that is the most accurate information about the progress and completion of curing the ink layer 26. The light sources for the reflectivity measurements can be separate, continuous, or pulsed light sources and can be the curing process light pulses themselves. Reflectivity for multiple wavelengths can be measured where, for example, the color of the ink layer changes during the curing process as a conductive ink film changes to a fully-cured, dry, electrically-conducting film.

Because the illuminated volume size may be smaller than the size of the desired features, it may be necessary to move the light 46 to particular locations on the surface of the ink layer 26. To facilitate this, two optional components are illustrated in FIG. 1: an X-Y positioner for the light source 50 and/or an X-Y beam positioner 56 for positioning the light 46. Both X-Y beam positioners 56 and light source positioners 50 are known to those of skill in the art, and can be controlled with electrical signals from the control system 32.

In some embodiments, it is desirable to uniformly cure the printed layers of material. To achieve uniform curing, the dose of photons from the light 46 is controlled. This can be accomplished either by pulsing the light source 40 off and on as the light 46 is positioned over each desired portion of the deposited material, or by controlling the intensity (e.g., by using a modulator 44) and/or the speed of movement of the light 46 as it moves along a path of the area being cured. In another embodiment, suitable curing may be achievable using non-constant light intensity at each position of the deposited layer of material. For example, improved curing may be attained by using a short high-intensity pulse of light 46 followed by a longer lower intensity pulse, or visa-versa.

The high intensity and short duration of the pulses of light that rapidly and selectively illuminate and heat controlled areas of the deposited ink layer are desirable because the action of the light is local and very rapid. This enables curing of the ink into a conductive layer without significant heating of the whole area and volume of the printed electronics circuit because the area being illuminated is small and because the time between pulses of light is long compared to the duration of the pulse.

While illustrative embodiments have been illustrated and described, it will be appreciated that various changes can be made therein without departing from the spirit and scope of the claimed subject matter.

The embodiments of the invention in which an exclusive property or privilege is claimed are defined as follows:

1. A curing system, comprising:
   a support configured to support a substrate having a curable material deposited thereon;
   a first light source in optical communication with a first location on the support corresponding to a portion of the curable material deposited on the substrate, wherein the first light source is configured to provide local heating to the first location to selectively heat the portion of the curable material independent of heating adjacent areas of the curable material, and wherein the local heating is sufficient to cure the curable material;
   a detector configured to monitor light from the first light source that impinges on the curable material at the first location; and
   a control system configured to control light emitted from the first light source in response to information received from the detector.

2. The curing system of claim 1, wherein the curable material is a curable conductive ink.

3. The curing system of claim 1, wherein the first light source is selected from the group consisting of a laser, a high-intensity lamp, and a flash lamp.

4. The curing system of claim 1, wherein the detector is a photodetector.

5. The curing system of claim 1, further comprising a second light source in optical communication with the first location on the support.

6. The curing system of claim 1, further comprising a lens module positioned between the first light source and the first location on the support.

7. The curing system of claim 1, further comprising a modulator positioned between the first light source and the first location on the support.

8. The curing system of claim 1, further comprising an X-Y positioning device for the first light source.

9. The curing system of claim 1, wherein the control system is further configured to control one or more components between the first light source and the first location.

10. The curing system of claim 9, wherein the one or more components are selected from the group consisting of a lens, a modulator, and an X-Y beam positioner.

11. The curing system of claim 1, wherein the control system is further configured to modify an operational parameter of the first light source.

12. The curing system of claim 11, wherein the operational parameter of the first light source is selected from the group consisting of wavelength, pulse length, interval between pulses, and intensity.

13. The curing system of claim 6, wherein the lens is configured to adjust the focus of light emitted from the first light source.

14. The curing system of claim 7, wherein the modulator is configured to vary the intensity of light emitted from the first light source.

15. The curing system of claim 1, further comprising an X-Y beam positioner positioned between the first light source and the first location on the support.

16. The curing system of claim 15, wherein the X-Y beam positioner is configured to controllably direct the light emitted from the first light source to the first location on the support.

17. A curing system, comprising:
- a substrate having an area of curable material deposited thereon;
- a support configured to support the substrate;
- a first light source in optical communication with the substrate, wherein the first light source is configured to provide local heating to a portion of the area of curable material to selectively heat the portion of the area of curable material independent of heating the remaining area of the curable material, and wherein the local heating is sufficient to cure the curable material;
- a detector configured to monitor light from the first light source that impinges on the curable material at the first location; and
- a control system configured to control light emitted from the first light source in response to information received from the detector.

* * * * *

UNITED STATES PATENT AND TRADEMARK OFFICE
CERTIFICATE OF CORRECTION

| | | |
|---|---|---|
| PATENT NO. | : 8,463,116 B2 | Page 1 of 1 |
| APPLICATION NO. | : 12/165892 | |
| DATED | : June 11, 2013 | |
| INVENTOR(S) | : Hirahara et al. | |

It is certified that error appears in the above-identified patent and that said Letters Patent is hereby corrected as shown below:

Title Page, in Item (75), under "Inventors", in Column 1, Line 2, delete "David L Lee," and insert -- David L. Lee, --, therefor.

In the Specifications

In Column 3, Line 13, delete "DESCRIPTION" and insert -- BRIEF DESCRIPTION --, therefor.

In Column 3, Line 16, delete "of this the" and insert -- of the --, therefor.

In Column 3, Line 29, delete "an representative" and insert -- a representative --, therefor.

In Column 4, Line 50, delete "an representative" and insert -- a representative --, therefor.

In Column 4, Line 53, delete "an representative" and insert -- a representative --, therefor.

In Column 6, Line 26, delete "ink Layer 26." and insert -- ink layer 26. --, therefor.

Signed and Sealed this
Eighteenth Day of March, 2014

Michelle K. Lee
*Deputy Director of the United States Patent and Trademark Office*